United States Patent [19]

Yamasue et al.

[11] 4,259,434
[45] Mar. 31, 1981

[54] METHOD FOR DEVELOPING POSITIVE ACTING LIGHT-SENSITIVE PLANOGRAPHIC PRINTING PLATE

[75] Inventors: Kotaro Yamasue; Hiroshi Takahashi; Hirokazu Sakaki; Akira Nishioka, all of Shizuoka, Japan

[73] Assignee: Fuji Photo Film Co., Ltd., Ashigara, Japan

[21] Appl. No.: 145,105

[22] Filed: Apr. 30, 1980

Related U.S. Application Data

[63] Continuation-in-part of Ser. No. 954,033, Oct. 23, 1978, abandoned.

[30] Foreign Application Priority Data

| Oct. 24, 1977 | [JP] | Japan | 52-127338 |
| Oct. 24, 1978 | [AU] | Australia | A7596 |
| Oct. 24, 1978 | [DE] | Fed. Rep. of Germany | 2846256 |
| Oct. 24, 1978 | [FR] | France | 78 30174 |
| Aug. 8, 1978 | [JP] | Japan | 53-96307 |

[51] Int. Cl.³ .............................................. G03F 7/02
[52] U.S. Cl. ..................................... 430/302; 430/141
[58] Field of Search ........................ 340/302, 141, 193

[56] References Cited

U.S. PATENT DOCUMENTS

| 3,869,292 | 3/1975 | Peters | 430/193 |
| 4,123,279 | 10/1978 | Kobayashi | 430/302 |

OTHER PUBLICATIONS

DeForest = Photoresist Materials and Processes, McGraw-Hill Book Company, New York, Jun. 19, 1975, pp. 194-195.

*Primary Examiner*—Won H. Louie, Jr.
*Attorney, Agent, or Firm*—Sughrue, Rothwell, Mion, Zinn and Macpeak

[57] ABSTRACT

A development method which comprises imagewise exposing a positive acting light-sensitive planographic printing plate comprising an aluminum support and a light-sensitive layer of an o-quinonediazide compound formed thereon, and then developing the exposed plate with a developer, comprising an aqueous solution of an alkali metal silicate, adding a supplementary solution comprising an aqueous solution of an alkali metal silicate to the developer to compensate for the degradation of the developer brought about by development and/or by carbon dioxide in the air; wherein the developer comprises an aqueous solution of an alkali metal salt having an $[SiO_2]/[M]$ ratio of from 0.5 to 0.75 and an $SiO_2$ concentration of from 1 to 4% by weight based on the total weight of the developer, where $[SiO_2]$ represents the concentration of $SiO_2$ per unit volume expressed as gram-molecules, and $[M]$ represents the concentration of the alkali metal per unit volume expressed as gram-atoms, and the supplementary solution comprises an aqueous solution of an alkali metal silicate having an $[SiO_2]/[M]$ ratio of from 0.25 to 0.75.

38 Claims, 2 Drawing Figures

METHOD FOR DEVELOPING POSITIVE ACTING LIGHT-SENSITIVE PLANOGRAPHIC PRINTING PLATE

CROSS-REFERENCE TO THE RELATED APPLICATION

This is a continuation-in-part application of Ser. No. 954,033, filed Oct. 23, 1978 now abandoned.

BACKGROUND OF THE INVENTION

1. Field of the Invention

This invention relates to a method for developing a positive acting light-sensitive planogrphic printing plate which is sometimes referred to as a presensitized plate (hereafter, a "PS plate"), and, more specifically, to a method for developing a positive acting PS plate containing an o-quinonediazide compound as a light-sensitive material in an automatic processor.

2. Description of the Prior Art

The positive acting PS plate which has been most widely used heretofore comprises an aluminum support having formed thereon a light-sensitive layer of an o-quinonediazide compound. The o-quinonediazide compound is a compound containing a structural unit of the general formula (I) below. It is known that when exposed to actinic light, this compound decomposes to a carboxyl-containing compound represented by the general formula (II) below (see O. Süs, *Liebigs Annalen der Chemie*, Vol. 556, page 65 (1944)).

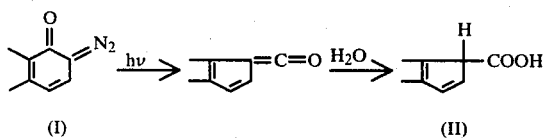

Thus, when a positive acting PS plate consisting of an aluminum support and a light-sensitive layer of the o-quinonediazide is exposed to actinic light through a positive transparency, the o-quinonediazide compound present in the exposed area of the light-sensitive layer changes to the corresponding carboxylic acid. Development of the exposed PS plate with an alkaline aqueous solution will, therefore, result in the removal of only the exposed area of the light-sensitive layer, and the surface of the support is revealed. Since the surface of the aluminum support is hydrophilic, the uncovered portion (non-image area) of the support holds water and repels the greasy ink used in planography. The area (image area) in which the light-sensitive layer remains after development is oleophilic and repels water, but holds the greasy ink.

Various alkaline aqueous solutions are known for use as developers for such positive acting PS plates, but an aqueous solution of sodium silicate is most preferred. The aqueous sodium silicate solution has a poor etching action, i.e., the amount which is etched when an aluminum plate is immersed in a sodium silicate solution is less than that in a sodium hydroxide solution having the same pH, on the aluminum support, and, moreover, its developing ability can be adjusted to some extent by varying the ratio of silicon oxide ($SiO_2$) to sodium oxide ($Na_2O$) in the sodium silicate (generally referred to as the $SiO_2/Na_2O$ mole ratio) and the concentrations of the solution.

In recent years, the printing industry has widely used automatic processors for PS plates in order to improve and standardize the plate-making process. Those which are in general use are of the developer spraying type schematically shown in FIGS. 1 and 2 of the accompanying drawings. This type of processor includes a conveying passageway through which a PS plate 2 is conveyed in a direction of the arrow by a conveyor means such as feed rolls 1, and a plurality of nozzle pipes 3 above the conveying passageway (and if also desired, below it as shown by the dotted line). As the PS plate 2 is conveyed in the direction of the arrow, a developer 5 fed from a tank 4 is sprayed against the surface of the light-sensitive layer of the plate through the nozzles 3. If required, the surface of the light-sensitive layer is rubbed by brush rollers (not shown) or the like. Thus, the exposed PS plate is processed. The developer is adapted to be passed through a filter 6 to remove insoluble materials, and then recovered and sent to the tank 4. In the automatic processor shown in FIG. 1, the area of contact of the developer to the tank with air is smaller than in the automatic processor shown in FIG. 2, and, therefore, the developer is less deteriorated by the carbon dioxide in the air.

In processing a PS plates in an automatic processor of this type, it is desirable from the standpoint of working efficiency that once a developer has been charged to the developer tank, as many PS plates as possible should be processed without replacing the developer in the tank. In order to change the exhausted developer, the operation of the automatic processor must be suspended for several minutes, and PS plates cannot be developed during this period.

Since the developer is an alkaline aqueous solution and the exposed portion of the light-sensitive layer of the PS plate contains a carboxyl-containing compound as stated hereinabove, the developer will naturally be degraded as the amount of the imagewise exposed positive acting PS plates developed increases. The accumulation of the ingredients of the exposed light-sensitive layer which have dissolved in the developer, the neutralization of the developer with carbon dioxide in the air, and the decrease of the amount of the developer in the developer tank as a result of its being carried away by the processed PS plates, accelerate the deterioration of the developer.

When an aqueous solution of sodium silicate with a relatively high $SiO_2$ concentration which has a comparatively broad development latitude (i.e., the range of developing conditions with which it will give proper development results) is used as a developer, $SiO_2$ precipitates in the nozzles of the processor as the number of processed PS plates increases, thus, posing the problem of nozzle clogging. The frequency with which the developer in the tank must be changed and the automatic processor must be washed is, therefore, increased. On the other hand, when an aqueous solution of sodium silicate having a comparative low $SiO_2$ concentration is used, the buffering ability of the developer decreases, and the developer itself has a low processing capability (i.e., the area of a PS plate which can be developed without any appreciable decrease in sensitivity by a unit of developer is small). In addition, the developer will easily undergo deterioration by carbon dioxide gas present in the air. The frequency of replacing the developer must also be increased.

SUMMARY OF THE INVENTION

It is, therefore, an object of this invention to provide an improved method for developing PS plates which can develop a number of positive acting PS plates using a predetermined amount of the same developer.

Another object of this invention is to provide a method which can develop a number of positive acting PS plates without forming insoluble materials in the developer.

Still another object of this invention is to provide a method in which the nozzles of a sprayer adapted to spray a developer against the surface of a light-sensitive layer in the conventional automatic processor will not be clogged even when a large number of positive acting PS plates are developed by the automatic processor.

A further object of this invention is to provide a development method which can process a large number of positive acting PS plates by an automatic processor without exchanging the developer in the processor for a long period of time.

We have now found that these and other objects of the invention can be achieved by a development method which comprises imagewise exposing a positive acting light-sensitive planographic printing plate comprising an aluminum plate having formed thereon a light-sensitive layer of an o-quinonediazide compound, and then developing the exposed plate with a developer comprising an aqueous solution of an alkali metal silicate, adding a supplementary solution comprising an aqueous solution of an alkali metal silicate to the developer to compensate for the degradation of the developer by development and/or by carbon dioxide in the air; wherein said developer comprises an aqueous solution of an alkali metal salt having an $[SiO_2]/[M]$ ratio, wherein $[SiO_2]$ represents the concentration of $SiO_2$ per unit volume expressed in gram-molecules, and $[M]$ represents the concentration of alkali metal per unit volume expressed in gram-atoms, of from 0.5 to 0.75 and an $SiO_2$ concentration of from 1 to 4% by weight based on the total weight of the developer, and said supplementary solution comprises an aqueous solution of an alkali metal silicate having an $[SiO_2]/[M]$ ratio of from 0.25 to 0.75.

On the other hand, it has also been found that when too many positive acting PS plates are processed using the developer and supplementary solution mentioned above, insoluble materials form in the developer and adhere to PS plate conveyor rolls of the automatic processor, resulting in the clogging of the nozzles and filter of the automatic processor. This phenomenon is especially pronounced when developing positive acting PS plates which have an aluminum support the surface of which has been anodically oxidized. It has been found, however, this drawback can be eliminated if each of the developer and the supplementary solution contains potassium in an amount of at least 20% based on the total amount in gram-atoms of the alkali metal present therein.

DETAILED DESCRIPTION OF THE INVENTION

Figure 1:
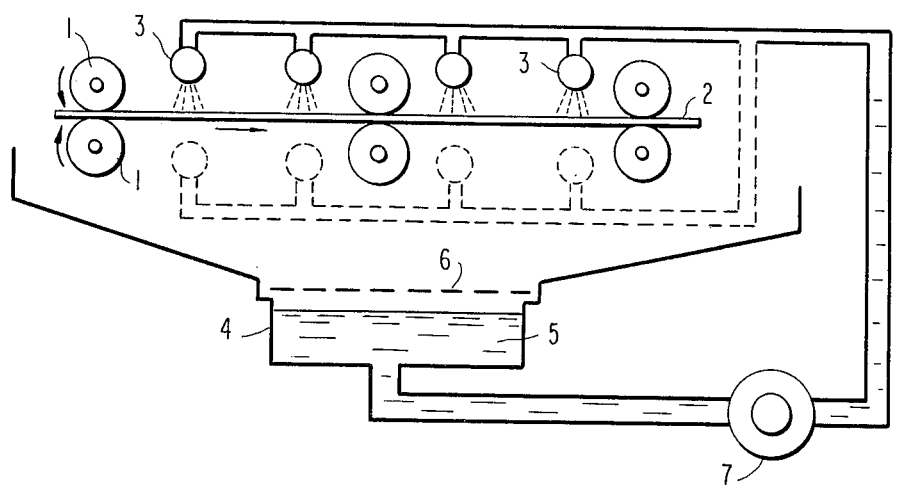
FIGS. 1 and 2 illustrate automatic processors generally used to process PS plates.

The positive acting PS plate to which the development method of the invention is applied consists basically of an aluminum plate and a light-sensitive layer of an o-quinonediazide formed thereon. Suitable aluminum supports include a pure aluminum plate and aluminum alloy plates. Plastic films having aluminum laminated or vacuum-deposited thereon can also be used. Preferably, the surface of the aluminum plate is pre-treated by various methods, for example, by graining, dipping in an aqueous solution of sodium silicate, potassium fluorozirconate or a phosphate, or by anodic oxidation. An aluminum plate which has been grained and then dipped in an aqueous solution of sodium silicate as disclosed in U.S. Pat. No. 3,181,461 and an aluminum plate which has been anodically oxidized and then dipped in an aqueous solution of sodium silicate can also be used conveniently. The anodic oxidation can be effected, for example, by passing a current in an electrolytic solution consisting of at least one aqueous solution or non-aqueous solution of an inorganic acid such as phosphoric acid, chromic acid, sulfuric acid or boric acid, or an organic acid such as oxalic acid or sulfamic acid, or a salt thereof using an aluminum plate as an anode. Electrodeposition of silicate disclosed in U.S. Pat. No. 3,658,662 is also effective.

An aluminum support which has been electrolytically grained as disclosed in U.S. Pat. No. 4,087,341, Japanese Patent Publication No. 27481/71, and Japanese Laid-Open Patent Publication No. 30503/72 and then anodically oxidized as described above is also useful. Another suitable support is an aluminum plate support obtained by graining an aluminum support as described in U.S. Pat. No. 3,834,998, chemically etching it, and then anodically oxidizing it. Such hydrophilizing treatments are carried out not only for the purpose of rendering the surface of the support hydrophilic, but also for the purpose of preventing an undesirable reaction with a light-sensitive composition to be coated thereon and increasing the adhesion of the support to the light-sensitive layer.

The light-sensitive layer formed on the hydrophilic surface of the support contains an o-quinonediazide compound. An especially preferred o-quinonediazide compound is an o-naphthoquinonediazide compound. Such compounds are described in a number of publications including U.S. Pat. Nos. 3,046,110, 3,046,111, 3,046,121, 3,046,115, 3,046,118, 3,046,119, 3,046,120, 3,046,121, 3,046,122, 3,046,123, 3,061,430, 3,102,809, 3,106,465, 3,635,707 and 3,647,443, and can also be used conveniently in the present invention. Preferred o-naphthoquinonediazide compounds are o-naphthoquinonediazide sulfonic acid esters or o-naphthoquinonediazide carboxylic acid esters of aromatic hydroxy compounds, and o-naphthoquinonediazide sulfonic acid amides or o-naphthoquinonediazide carboxylic acid amides of aromatic amino compounds. In particular, the product obtained by the ester-forming reaction of a condensate between pyrogallol and acetone with o-naphthoquinonediazide sulfonic acid which is described in U.S. Pat. No. 3,635,709; the product obtained by the ester-forming reaction of a hydroxy-terminated polyester with o-naphthoquinonediazide sulfonic acid or o-naphthoquinonediazide carboxylic acid which is described in U.S. Pat. No. 4,028,111; the product obtained by the ester-forming reaction of a homopolymer of p-hydroxystyrene or a copolymer of p-hydroxystyrene with another copolymerizable monomer with o-naphthoquinonediazide carboxylic acid which is described in British Pat. No. 1,494,043; and the product obtained by the amide-forming reaction of a copolymer of p-aminostyrene with another copolymerizable monomer with o-naphthoquinonediazide sulfonic acid or o-naphthoquinonediazide carboxylic acid which is described in U.S. Pat. No. 3,759,711 are preferred.

Although these o-quinonediazide compounds can be used alone, it is preferable to mix an o-quinonediazide compound with an alkali-soluble resin, and use the mixture as a light-sensitive layer. Suitable alkali-soluble resins include novolac-type phenolic resins, specifically a phenolformaldehyde resin, an o-cresol-formaldehyde resin, and an m-cresol-formaldehyde resin. Furthermore, as disclosed in U.S. Pat. No. 4,123,279, the use of a mixture of the above-exemplified phenolic resin with a condensate of phenol or cresol substituted by an alkyl group having 3 to 8 carbon atoms and formaldehyde, such as a t-butylphenol-formaldehyde resin, is more preferred. The amount of the alkali-soluble resin is about 50 to about 85% by weight, preferably 60 to 80% by weight, based on the weight of the light-sensitive layer, the balance of the layer being o-quinonediazide compound.

If desired, the light-sensitive layer comprising the o-quinonediazide compound may further contain additives, such as dyes, plasticizers, and ingredients which give printout properties. These materials are well known in the art and their discussion below should not be considered as limiting.

Dyes are used to give the image area contrast from the non-image area (the surface of the support) after the exposure and development of a PS plate. Preferred dyes are alcohol-soluble dyes, such as C.I. 26, 105 (Oil Red RR), C.I. 21, 260 (Oil Scarlet #308), C.I. 74, 350 (Oil Blue), C.I. 52, 015 (Methylene Blue), and C.I. 42, 555 (Crystal Violet). Such a dye is added in an amount sufficient to give a clear contrast between the color of the hydrophilic surface of the uncovered support and the color of the remainder of the light-sensitive layer. Generally, the suitable amount of the dye is not more than about 7% by weight based on the total amount of the light-sensitive composition.

Plasticizers are desirably used to impart flexibility to the light-sensitive layer formed on the support. Examples of effective plasticizers for use in the invention include phthalate esters such as dimethyl phthalate, diethyl phthalate, dibutyl phthalate, diisobutyl phthalate, dioctyl phthalate, octyl capryl phthalate, dicyclohexyl phthalate, di(tredecyl) phthalate, butyl benzyl phthalate, diisodecyl phthalate, diallyl phthalate; glycol esters such as dimethyl glycol phthalate, ethylphthallyl ethyl glycolate, methyl phthallyl ethyl glycolate, butyl phthallyl butyl glycolate and triethylene glycol dicaprylate; phosphate esters such as tricresyl phosphate and triphenyl phosphate; aliphatic dibasic acid esters such as diisobutyl adipate, dioctyl adipate, dimethyl sebacate, dibutyl sebacate, dioctyl azelate and dibutyl maleate; polyglycidyl methacrylate; triethyl citrate; glycerin triacetyl ester; and butyl laurate. The amount of the plasticizer is not more than about 5% by weight based on the total amount of the light-sensitive composition.

A print-out material is added to permit viewing of a visible image immediately upon the imagewise exposure of the light-sensitive layer of a PS plate. It includes, for example, the pH indicator disclosed in British Pat. Publication No. 1,041,463, the combination of o-naphthoquinonediazide-4-sulfonyl chloride and a dye which is disclosed in U.S. Pat. No. 3,969,118, and the photochromic compound disclosed in Japanese Patent Publication No. 6413/69. Furthermore, as stated in U.S. Pat. No. 4,115,128, a cyclic acid anhydride may be incorporated into the light-sensitive layer to increase its sensitivity.

The light-sensitive composition composed of the o-naphthoquinonediazide is coated on a support from solution in a suitable solvent. Suitable solvents include, for example, glycol ethers such as ethylene glycol monomethyl ether, ethylene glycol monoethyl ether and 2-methoxyethyl acetate, ketones such as acetone, methyl ethyl ketone and cyclohexanone, and chlorinated hydrocarbons such as ethylene dichloride.

The amount of the light-sensitive layer composed of the o-quinonediazide compound formed on the support is about 0.5 to about 7 $g/m^2$, preferably 1.5 to 3 $g/m^2$.

When the resulting positive acting PS plate is exposed to an abundance of actinic light from a carbon arc lamp, mercury lamp, metal halide lamp, xenon lamp or tungsten lamp through an image-bearing transparency, the exposed portion turns alkali-soluble. Accordingly, the exposed portion of the light-sensitive layer is washed away with an alkaline aqueous solution to reveal the hydrophilic surface of the support.

In accordance with the present invention, an aqueous solution of an alkali metal salt having an $[SiO_2]/[M]$ ratio of from 0.5 to 0.75, most preferably from 0.5 to 0.65, and an $SiO_2$ concentration of 1 to 4% by weight, most preferably 1.0 to 2.0% by weight, is used as a developer. When an aqueous solution of an alkali metal silicate having an $[SiO_2]/[M]$ ratio of less than 0.5 and an $SiO_2$ concentration of less than 1% by weight is used as a developer, the pH buffering ability of the developer is low. Hence, upon the addition of a supplementary solution described below, the properties of the developer change greatly and a planographic printing plate of uniform quality cannot be obtained. On the other hand, when the developer has an $[SiO_2]/[M]$ ratio of larger than 0.75 and an $SiO_2$ concentration of more than 4% by weight, the nozzles of an automatic processor clog within the course of several days due to the precipitation of $SiO_2$. Furthermore, the viscosity of the developer increases, and it cannot process a good number of exposed plates.

The supplementary solution used in this invention in an aqueous solution of an alkali metal silicate having an $[SiO_2]/[M]$ ratio of from 0.25 to 0.75 and an $SiO_2$ concentration of preferably 1 to 4% by weight. When the $[SiO_2]/[M]$ ratio of the supplementary solution is less than 0.25, the latitude in the amount of the supplementary solution which may be added is narrow and a high precision device would be required to supply the supplementary solution. On the other hand, when the supplementary solution has an $[SiO_2]/[M]$ ratio larger than 0.75, the amount of the supplementary solution becomes large, and the amount of the solution to be recovered increases, which, in turn, causes the nozzles of the automatic processor to become clogged.

In both of the developer and the supplementary solution, the alkali metal [M] of the alkali metal silicate can be sodium, potassium or lithium.

A developer and a supplementary solution which are used in a preferred embodiment of the invention are described below.

The developer and the supplementary solutions used in the preferred embodiment of the invention are both aqueous solutions of alkali metal silicates. At least 20% of the total gram-atoms of the alkali metal in these aqueous solutions preferably consists of potassium. By using aqueous solutions of silicate containing this specified amount of potassium, insoluble matter does not form in the developer even when a large number of positive acting PS plates are processed. Accordingly, this obviates nozzle clogging in the sprayer of the automatic processing machine and prevents the clogging of a filter in the automatic process through which the used developer passes for recovery. It is very surprising that such an effect is also obtained when developing large number of positive acting PS plates having an anodically oxidized aluminum plate as a support in which case the conventional processes suffer a remarkable formation of insoluble matter. Amounts of potassium up to 100% are suitable, but the preferred amount of potassium is from about 20% to about 90%, and the especially preferred amount is about 30% to about 80%, based on the total amount of alkali metal.

The above discussion does not mean that developer and supplementary solutions not containing an amount of potassium as preferred in this invention are unsuitable. Indeed, such solutions are effective but when conducting development on a large scale, the presence of potassium improves the stability of the solutions. When processing printing plates not containing an anodized aluminum base, the presence of potassium is not as important.

Preferred supplies of potassium include potassium hydroxide, potassium borate, potassium pyrophosphate, potassium tertiary phosphate, potassium polyphosphate and potassium silicate. These potassium sources may be used singly or in combinations of two or more. Scarcely any effect is observed when using potassium salts having a relatively high dissociation constant, such as potassium chloride, potassium iodide, potassium nitrate, potassium citrate or potassium acetate.

The aliali metal in the alkali metal silicate includes, for example, lithium and sodium in addition to potassium. Preferred alkali metals are potassium and sodium.

An especially preferred developer for use in the method of this invention is an aqueous solution of an alkali metal silicate having an $[SiO_2]/[M]$ ratio of from 0.5 to 0.75, in which $[SiO_2]$ represents the concentration of $SiO_2$ in a unit volume expressed in gram-molecules, and $[M]$ represents the concentration of alkali metal in a unit volume expressed in gram-atoms and an $SiO_2$ concentration of from 1 to 4% by weight. Also preferred is an aqueous solution of an alkali metal silicate having an $[SiO_2]/[M]$ ratio of from 0.5 to 0.75 and an $SiO_2$ concentration of 1 to 3% by weight. The most preferred developer is an aqueous solution having an $[SiO_2]/[M]$ ratio of 0.5 to 0.65 and an $SiO_2$ concentration of 1.0 to 2.0% by weight.

An especially preferred supplementary solution is an aqueous solution of an alkali metal silicate having a potassium concentration of at least 20%, and an $[SiO_2]/[M]$ ratio of from 0.25 to 0.75.

The supplementary solution is added for the purpose of compensating the ingredients (mainly alkali ingredients) of the developer which have been consumed as a result of processing positive acting PS plates, developer which has been carried away adhering to the developed PS plates, and the alkali ingredients which have been neutralized by the carbon dioxide in the air. Accordingly, the supplementary solution may be any aqueous solution of an alkali metal silicate which, when added to the developer, is able to maintain within the above-specified composition for the developer as it is used to process positive acting PS plates or as time elapses. For example, when an aqueous solution of an alkali metal silicate having the same $[SiO_2]/[M]$ ratio as the developer is used as the supplementary solution, it may have a higher alkali metal silicate concentration. When the supplementary solution has the same $SiO_2$ concentration as the developer, its $[SiO_2]/[M]$ ratio may be lower than that of the developer. Those skilled in the art can easily determine combinations of the developer and the supplementary solution. The supplementary solution may be divided into two or more portions, for example, an aqueous solution of potassium hydroxide and an aqueous solution of sodium silicate, which can be conveniently combined to obtain supplementary solutions having various potassium concentrations, and these portions may be mixed at the time of adding to the developer. For example, a procedure may be taken in which the supplementary solution is prepared as a concentrated solution, and it is diluted with water at the time of adding to the developer. Irrespective of the composition of the aqueous solution of alkali metal silicate, the gram-atoms of potassium should be always at least 20% based on the total gram-atoms of the alkali metal contained in the developer or supplementary solution in the preferred embodiment of the invention.

If the amount of potassium is less than about 20% based on the total alkali metal content of the developer or supplementary solution, insoluble matter occurs in the developer as it is used to process positive acting PS plates. The insoluble matter clogs the spray nozzles or the filter through which to recover the used developer. It is extremely important, therefore, to maintain the concentration of potassium in the developer at not less than 20%. Generally, the developer is supplied to the user in concentrated form, and the user dilutes it with water. When a concentrated aqueous solution of sodium silicate having an $[SiO_2]/[M]$ ratio of not more than 0.75 is diluted with water containing a divalent or higher metal ion such as calcium, magnesium or aluminum (for example, water having a German hardness of 36°), the solution becomes whitishly turbid and forms a precipitate, which, in turn, will clog the filter of an automatic processor. In contrast, the developer and the supplementary solution in concentrated form in accordance with the preferred embodiment of the present invention containing potassium do not become whitishly turbid even when diluted with such hard water. Accordingly, the developer or supplementary solution prepared in accordance with this invention can be used in an automatic processor without any adverse effect. When positive acting PS plates having an anodically oxidized aluminum plate support are processed with a developer containing an aqueous solution of sodium silicate in accordance with conventional techniques, a considerable amount of white deposit composed mainly of silicic acid forms on the surfaces of the conveyor rollers on the lower side of an automatic processor. In contrast, according to the preferred embodiment of the method of this invention, such a phenomenon is observed only slightly.

Development can be generally conducted at a temperature of about 15° to about 35° C. for a period of 30 to 90 seconds. The pH value of the developing solution can range from about pH 12 to about pH 14 which is a typical pH range for positive type developing solutions.

The developer and supplementary solution used in this invention may further contain an organic solvent to improve the permeability of the developer in the initial stage and also improve the developing rate. Examples of organic solvents are benzyl alcohol, 2-butoxyethanol, triethanolamine, diethanolamine, monoethanolamine, glycerol, ethylene glycol, polyethylene glycol, and polypropylene glycol. The organic solvent can be incorporated in the developer or supplementary solution so that its concentration in the developer is not more than 5% by weight based on the total weight of the developer.

The developer or supplementary solution used in this invention may further contain a surface active agent. This can increase the processing capacity of the developer (the amount of the light-sensitive layer which a unit volume of the developer can dissolve and remove), and broaden the range of the developing conditions (e.g., temperature, processing time) which will give optimum results. Preferred surface active agents include anionic surfactants and amphoteric surfactants. Specific examples of preferred anionic surfactants are alkylbenzenesulfonic acid salts (with the alkyl group containing 8 to 18, preferably 12 to 16, carbon atoms) such as sodium dodecylbenzenesulfonate, alkylnaphthalenesulfonic acid salts (with the alkyl group containing 3 to 10 carbon atoms) such as sodium isopropylnaphthalenesulfonate, a formaldehyde condensate of a naphthalenesulfonic acid salt, dialkylsulfosuccinic acid salts (with the alkyl group containing 2 to 18 carbon atoms), and dialkylamidosulfonic acid salts (with the alkyl group containing 11 to 17 carbon atoms). Specific examples of preferred amphoteric surface active agents include imidazoline derivatives and betaine-type compounds such as N-alkyl-N,N,N-tris(carboxymethyl) ammonium (with the alkyl group containing 12 to 18 carbon atoms) or N-alkyl-N-carboxymethyl-N,N-dihydroxyethylammoniums (with the alkyl group containing 12 to 18 carbon atoms). The amount of the surfactant is not particularly limited. But generally, it is incorporated in the developer or the supplementary solution so that its concentration in the developer in use will be maintained at about 0.003 to about 3% by weight, preferably 0.006 to 1% by weight, based on the total weight of the developer.

Furthermore, an antifoamer may be incorporated into the developer and the supplementary solution used in this invention. Suitable antifoamers are those described, for example, in U.S. Pat. Nos. 3,250,727 and 3,545,970, and British Pat. Nos. 1,382,901 and 1,387,713. Of these, organic silane compounds are preferred.

In the development method of this invention, the supplementary solution is added in an amount that will compensate the ingredients of the developer which have been consumed by the processing of positive acting PS plates, the developer which has been carried away by the processed positive acting PS plates, and/or the alkali components which have been neutralized with carbon dioxide in the air. For example, when the amount of positive acting PS plates which 1 liter of the developer can process is 2 m$^2$, the supplementary solution may be added every time 2 m$^2$/liter of positive acting PS plates are processed. Or the area of each PS plate to be processed may be measured, and the supplementary solution may be added in an amount corresponding to the measured area each time a PS plate has been processed.

Generally, the developing capacity of a developer is determined as follows:

A PS plate is exposed through a step tablet (for example, with 21 steps, the first one having an optical density of 0.10 with a density difference of 0.15 between two adjacent steps), and then developed. When the number of the solid black steps processed by the exhausted developer is one step less than the number of solid black steps processed by fresh developer, it is assumed that the processing capacity of the developer has reached its limit. By determining the amount of a supplementary solution which can cause such a developer at the limit of its processability to perform development to the original number of solid steps, it is possible to determine the time and amount of addition of the supplementary solution to the developer.

Alternatively, if one determines the pH of a developer at the limit of its processability and the pH of a fresh developer, it is possible to measure the addition of the supplementary solution such that the developer always has the pH exhibited by the fresh developer. This can be done, for example, by incorporating a pH measuring device in a developing tank of an automatic processor.

Irrespective of the method of addition, the supplementary solution is added to compensate for the changes of the ingredients of the developer which occur with time, and/or as a result of developing positive active PS plates.

The method of the present invention reduces the frequency of changing the developer, and enables the automatic processor to be used stably over long periods of time without washing.

The developing method of this invention also has the advantage that even when large quantities of positive acting PS plates are processed in a certain fixed amount of the same developer, insoluble materials do not form in the developer. The method of this invention is, therefore, especially applicable to automatic processing. When processing a positive acting PS plate having a support made of an aluminum plate having an anodically oxidized coating by conventional methods, there is a tendency for insoluble matter to form in the developer. According to the developing method of this invention, insoluble matter does not form in the developer even when large areas of positive acting PS plates of this kind are processed. Accordingly, the developing method of the invention is especially outstanding when applied to the processing of positive acting PS plates including a support of an anodically oxidized aluminum plate by an automatic processor.

The following Examples illustrate the present invention in more detail. In these Examples, all percentages and parts are by weight unless otherwise indicated.

EXAMPLE 1

1 part of polyhydroxyphenyl naphthoquinone-1,2-diazide-5-sulfonate obtained by the polycondensation of acetone and pyrogallol described in Example 1 of U.S. Pat. No. 3,635,709 and 2 parts of a novolac-type phenol-formaldehyde resin were dissolved in 20 parts of 2-methoxyethyl acetate and 20 parts of methyl ethyl ketone to form a light-sensitive solution. A sanded aluminum plate having a thickness of 0.3 mm was electrolytically oxidized to form an oxide coating at a rate of about 2 g/m$^2$, washed well, and dried. The light-sensitive solution was coated on the aluminum plate, and dried to form a positive acting PS plate having a light-sensitive layer at a rate of about 2.5 g/m$^2$. The PS plate was cut into a number of 1,003×800 mm pieces. These PS plates were exposed through a positive transparency to light from a 3 kw metal halide lamp for 60 seconds at a distance of 1 mm.

Figure 2:
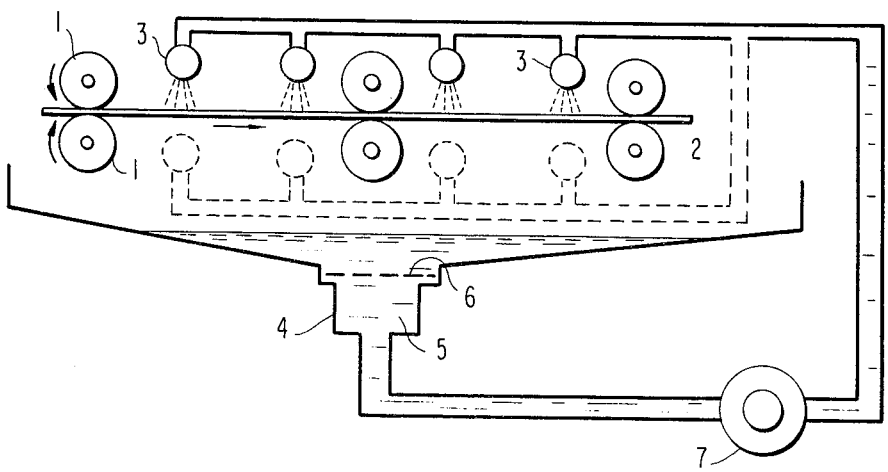

In the meantime, a tank (4) of an automatic processor of the type shown in FIG. 2 in the accompanying drawings which further included brush rollers for development was charged with 21 liters of an aqueous solution of sodium silicate having an [$SiO_2$]/[M] ratio of 0.6 and an $SiO_2$ content of 1.5% as a developer and 10 g of a betaine-type amphoteric surfactant (N-alkyl-N,N-dihydroxyethylbetaine). Twenty-five of the PS plates were processed with the above solution in the morning, and another twenty-five in the afternoon. The solution which was used for the development was left overnight in the automatic processor. The development was resumed the next morning. No clogging was seen in the nozzles of the automatic processor. However, when the processed PS plate was exposed through a step guide with a density difference of 0.15, the density was found to decrease by two steps (sensitivity about ½) over that attained on the previous day. Accordingly, 1.3 liters of a 1/7 concentrated product of this developer was added as a supplementary solution ([$SiO_2$]/[Na]=0.60). The sensitivity returned to that at the start of the previous day. Thereafter, 0.5 liter of the supplementary solution was added at each noon recess. The above operation was repeated for a week. No clogging of the nozzles of the automatic processor was seen, and there was hardly any change in sensitivity. Thus, printing plates could be obtained stably. The mixture of the developer and the supplementary solution used during this period had an [$SiO_2$]/[Na] ratio of 0.60 to 0.65 and an $SiO_2$ content of 1.5 to 2%.

Separately, PS plates prepared in the same method as described above were exposed, and developed in 21 liters of an aqueous solution of sodium silicate having an [$SiO_2$]/[Na] ratio of 1.9 and an $SiO_2$ content of 5% contained in a developer tank of an automatic processor. Twenty-five PS plates were processed in the morning, and another twenty-five in the afternoon. The developer was left overnight in the automatic processor, and the processing was resumed on the next morning. White crystals were observed to clog the nozzles through which the developer was sprayed and the amount of the developer it was possible to spray decreased considerably. Thus, using this developer, it is necessary to change the developer every day, and wash the nozzles. The amount of the developer discharged in the latter case was as large as 147 liters, whereas in the first case, the amount of the developer recovered was about 22 liters which was about 1/6 to 1/7 of the latter.

EXAMPLE 2

Positive acting PS plates prepared in the same way as in Example 1 were exposed, and processed with a developer having an [$SiO_2$]/[Na] ratio of 0.59 and an $SiO_2$ content of 1.3%. A solution having an [$SiO_2$]/[Na] ratio of 0.3 (supplementary solution A) was prepared by adding an aqueous solution of sodium hydroxide to the developer. From the second day onward, 3 liters of the supplementary solution was added in the morning and 0.5 liter of it at the noon recess. The processing of the PS plates was continued for two weeks. No clogging of the nozzles of the automatic processor was observed, and there was little change in gray scale. During this period, the mixture of the developer and the supplementary solution had an [$SiO_2$]/[Na] ratio of 0.58 to 0.59 and an $SiO_2$ content of 1.3 to 1.5%.

Separately, positive acting PS plates prepared as in Example 1 were exposed and processed in an automatic processor for 2 days using a developer having an [$SiO_2$]/[Na] ratio of 0.85 and an $SiO_2$ content of 4.3% and a supplementary solution having an [$SiO_2$]/[Na] ratio of 0.8 prepared by adding an aqueous solution of sodium hydroxide to the developer (supplementary solution B). In this case, the nozzles clogged, and the vicosity of the developer increased.

EXAMPLE 3

Positive acting PS plates prepared in the same way as in Example 1 were exposed and processed using a developer having an [$SiO_2$]/[Na] ratio of 0.58 and an $SiO_2$ content of 1.4%, and a supplementary solution having an [$SiO_2$]/[Na] ratio of 0.4 and prepared by adding an aqueous solution of sodium hydroxide to the developer. On the first day, the supplementary solution was not added, and a change in gray scale was within 1 step. On the second day onward, the supplementary solution was added in the morning and at the noon recess. In this manner, printing plates could be uniformly and stably processed.

Positive acting PS plates prepared in the same way as in Example 1 were exposed and processed using a developer having an [$SiO_2$]/[Na] ratio of 0.4 and an $SiO_2$ content of 0.8%, and the supplementary solution A of Example 2. On the first day, the supplementary solution was not added, and the gray scale decreased by three steps. When the supplementary solution was added every time five plates were processed, the change in gray scale could be confined within 1 step. On the second day onward, it was necessary to add supplementary solution at the top of the morning and at the noon recess, and also every time five plates were processed.

EXAMPLE 4

When in Example 2, an aqueous solution of sodium silicate having an [$SiO_2$]/[Na] ratio of 0.23 was used as a supplementary solution instead of the supplementary solution A, the latitude of the amount of the supplementary solution added was narrow. If the amount of the supplementary solution deviated 10%, over- or under-development occurred.

When supplementary solution A was added, however, no problem arose even if the amount of the supplement deviated as much 10%.

EXAMPLE 5

When in Example 2, a solution having an [$SiO_2$]/[Na] ratio of 0.8 was used instead of the supplementary solution A, the amount of the solution which had to be added was more than two times that of the solution A, and the amount of the developer recovered increased. Furthermore, the nozzles of the automatic processor were seen to be clogged.

EXAMPLE 6

A sanded aluminum plate having a thickness of 0.3 mm was anodically oxidized in sulfuric acid to form an oxide coating at a rate of about 3 g/m², washed well and dried. The same light-sensitive solution as used in Example 1 was coated on the aluminum plate, and dried to form a positive acting PS plate having a light-sensitive layer at a rate of about 2.5 g/m². The PS plate was cut into a number of pieces having a size of 1310×1050 mm. These were each exposed for 60 seconds through a positive transparency to light from a 3 kw metal halide lamp disposed at a distance of 1 m.

In the meantime, tank 4 of the same automatic developer used in Example 1 was charged with 21 liters of a developer prepared by diluting a base developer solution consisting of 332 g of an aqueous solution of sodium silicate (No. 3 of JIS) (with an $SiO_2$ content of 29% by weight and an $Na_2O$ content of 9.5%), 191 g of a 48% aqueous solution of potassium hydroxide, 3.2 g of a 36% aqueous solution of an amphoteric surfactant (N-alkyl-N,N-dihydroxyethylbetaine), 0.72 g of an organic silicone compound as an anti-foam agent, and 688 g of pure water, with water in a volume of 6 times the amount of the base developer solution. The PS plates were processed by this automatic processor. Every time one PS plate was processed, 86 ml of a supplementary solution prepared by diluting a base solution consisting of 238 g of sodium silicate (No. 3, JIS), 328 g of a 48% aqueous solution of potassium hydroxide and 645 g of pure water, with water in a volume of 4 times the amount of the base solution. After 15 plates were processed in this manner, processing was suspended for 1 hour. Because some decrease in sensitivity was noted during this period of suspension, 640 ml of a supplementary solution of the same composition was added in addition to that added with each plate. Then, 15 plates were further processed. The used developer was left in the automatic processor for 16 hours, and 3.4 liters of the above supplementary solution was added, after which the processing was resumed. This procedure was repeated, and 180 plates in total were processed. No clogging of the nozzles and the filter of the automatic processor was observed, nor was there the formation of a precipitate. Adhesion of a white deposit to the rollers was only slight. For checking sensitivity, positive acting PS plates to which a step tablet (with 21 steps with an optical density difference of 0.15 between adjacent steps) was printed were also processed. The difference in the number of solid steps was less than 1 step from that obtained at the time of processing the first plate. The percentage (gram-atoms) of potassium, the $[SiO_2]/[M]$ ratio and the $SiO_2$ content were 61%, 0.58, and 1.14%, respectively, for the developer, and 79%, 0.32, and 1.14%, respectively, for the supplementary solution.

Separately, a developer and a supplementary solution were prepared which contained an equimolar amount of $SiO_2$ and equal gram-atoms of an alkali metal consisting solely of sodium to the developer and supplementary solution used above. Specifically, a developer consisting of 360 g of sodium metasilicate, 66.0 g of sodium silicate (No. 3, JIS), 3.2 g of the same betaine-type amphoteric surfactant as above, 0.72 g of the same antifoamer as above, and 784 g of pure water, and a supplementary solution consisting of 360 g of sodium metasilicate, 66.0 g of sodium silicate (No. 3, JIS), 100 g of sodium hydroxide and 1233 g of pure water were respectively prepared, and diluted to the same ratios as described above. The PS plates of the same size as described above were processed in the same manner as above using the developer and supplementary solution so prepared. Heavy adhesion of a white deposit to the rollers occurred when 60 plates were processed. When 120 plates were processed, large amounts of a muddy precipitate formed to clog the filter. Thus, the circulation of the developer in the automatic processor was hampered.

EXAMPLE 7

Positive acting PS plates having a size of 1310×1050 mm prepared in the same manner as in Example 6 were exposed, and automatically processed in a processor of the same type as used in Example 1. The tank of the processor was charged with 21 liters of a developer obtained by diluting a base developer solution consisting of 684 g of sodium silicate (No. 3, JIS), 128 g of a 48% aqueous solution of potassium hydroxide and 420 g of pure water with 7 times its amount of water. Every time one plate was processed, 106 ml of a supplementary solution prepared by diluting a base solution consisting of 487 g of sodium silicate (No. 3, JIS), 285.5 g of a 48% aqueous solution of potassium hydroxide and 440 g of pure water, with 5 times its amount of water was added. Under these conditions, PS plates in an amount of 3 m²/liter of the developer charged were processed. After the processing, the developer was left in the automatic processor for 14 hours. Then, 4.8 liters of the above supplementary solution was added, and the processing was resumed. Every time one plate was processed, 106 ml of the supplementary solution was added, and PS plates in an amount of 8 m²/liter of the developer charged were processed. No adhesion of a white deposit to the rollers was seen. Clogging of the filter and the formation of a precipitate were neither observed. Furthermore, to check sensitivity, the change of the number of solid steps was examined in the same way as in Example 6. The change was within one step. The proportion of potassium in the alkali metal, the ratio of $SiO_2$/alkali metal, and the $SiO_2$ content were 52%, 0.75, and 2.34%, respectively, for the developer, and 62%, 0.58 and 2.33%, respectively, for the supplementary solution.

EXAMPLE 8

The same base developer as used for comparison in Example 6 was diluted 7 times with water, and 21 liters of the diluted developer was charged into the same automatic processor as used in Example 6. Positive acting PS plates (1003×800 mm in size) prepared in the same manner as described in Example 6 were exposed, and processed. While adding 60 ml of a supplementary solution obtained by diluting the above base developer to 3 times its amount of water every time one plate was processed, the PS plates were processed in an amount of 3 m²/liter of the developer initially charged. When one liter of the used developer was allowed to stand for four days in a beaker, about 0.5 g, as a dry weight, of a muddy precipitate formed.

Separately, 98.7 g of potassium pyrophosphate was dissolved in 21 liters of a developer having the same composition as described above, and the solution was charged into the same automatic processor. The same positive acting PS plates were exposed, and processed by the automatic processor. Every time one plate was processed, 60 ml of a supplementary solution prepared by diluting the aforesaid base developer with 3 times its amount with water, and dissolving 2.0 g of potassium pyrophosphate in 1 liter of the diluted solution. The plates were processed in a total amount of 3 m²/liter of the developer charged. The used developer was allowed to stand under the same conditions as above. No formation of a muddy precipitate was observed.

When potassium pyrophosphate was added, the potassium content of the developer based on the total alkali metal was about 24%.

Similarly, 88.2 g of potassium polyphosphate was dissolved in 21 liters of the same developer as above which did not contain potassium. A supplementary solution was prepared by diluting the above base developer to 3 times, and dissolving 1.8 g of potassium polyphosphate in 1 liter of the diluted solution. Using these solutions, the same experiment as above was conducted. No formation of a muddy precipitate was noted. The potassium content based on the total alkali metal was found to be about 21%.

EXAMPLE 9

A positive acting PS plate prepared as in Example 6 was cut into pieces having a size of 1003 mm × 800 mm. The PS plates were exposed, and processed by an automatic processor of the type shown in FIG. 1. The tank of the processor was charged with 21 liters of a developer prepared by diluting the base developer containing 61% of potassium as described in Example 6 with 7 times its amount with water. On the first day, 20 plates were processed in the morning, and then 1 liter of a supplementary solution obtained by diluting the base supplementary solution containing 79% of potassium as described in Example 6 with 5 times its amount with water was added. In the afternoon, another 20 plates were processed. Thereafter, the supplementary solution was added in an amount of 3 liters in the morning and 1 liter at the noon recess, and 40 plates were processed every day over 10 days. No clogging of the filter of the processor was seen, nor was there the formation of a muddy precipitate.

EXAMPLE 10

Positive acting PS plates with a size of 1003 × 800 mm prepared in the same way as in Example 6 were exposed, and processed in the same automatic developer as in Example 6. The tank of the processor was charged with 35 liters of a solution prepared by diluting the base developer containing 61% of potassium as described in Example 6 with 7 times its amount with water, and a supplementary solution prepared by diluting the same developer to 3 times was used. Every time one plate was processed, 50 ml of the supplementary solution was added. Also, the supplementary solution was added in an amount of 500 ml, and 1,450 ml respectively at the noon recess, and at the top of the morning operation from the second day. Under these conditions, 80 plates were processed every day over 6 days (a total of 480 plates).

No formation of a muddy precipitate nor clogging of the filter was noted, and the processing conditions could be stably maintained and, thus, the PS plates could be uniformly processed.

While the invention has been described in detail and with reference to specific embodiments thereof, it will be apparent to one skilled in the art that various changes and modifications can be made therein without departing from the spirit and scope thereof.

What is claimed is:

1. A development method which comprises imagewise exposing a positive acting light-sensitive planographic printing plate comprising an aluminum support and a light-sensitive layer of an o-quinonediazide compound formed thereon, and then developing the exposed plate with a developer comprising an aqueous solution of an alkali metal silicate, adding a supplementary solution comprising an aqueous solution of an alkali metal silicate to the developer to compensate for the degradation of the developer brought about by development and/or by carbon dioxide in the air; wherein said developer comprises an aqueous solution of an alkali metal salt having an $[SiO_2]/[M]$ ratio of from 0.5 to 0.75 and an $SiO_2$ concentration of from 1 to 4% by weight based on the total weight of the developer, where $[SiO_2]$ represents the concentration of $SiO_2$ per unit volume expressed as gram-molecules, and $[M]$ represents the concentration of the alkali metal per unit volume expressed as gram-atoms, and said supplementary solution comprises an aqueous solution of an alkali metal silicate having an $[SiO_2]/[M]$ ratio of from 0.25 to 0.75.

2. The method of claim 1, wherein each of said developer and supplementary solution contains at least 20%, as gram-atoms, of potassium based on the total amount of alkali metal.

3. The method of claim 2, wherein the source of said potassium present in the developer and the supplementary solution is at least one member selected from the group consisting of potassium hydroxide, potassium borate, potassium pyrophosphate, potassium tertiary phosphate, potassium polyphosphate and potassium silicate.

4. The method of claim 2, wherein at least one of an anionic or amphoteric surface active agent is added to the developer and the supplementary solution.

5. A development method which comprises imagewise exposing a number of positive acting light-sensitive planographic printing plates each consisting of an aluminum plate having an anodically oxidized surface and a light-sensitive layer of an o-quinonediazide compound formed thereon, and developing the exposed plates with a developer comprising an aqueous solution of an alkali metal silicate to remove the exposed areas of the light-sensitive layer, wherein development is performed while said developer is continuously compensated with a supplementary solution comprising an aqueous solution of an alkali metal silicate having an $[SiO_2]/[M]$ ratio of from 0.25 to 0.75 such that said developer has an $[SiO_2]/[M]$ ratio of from 0.5 to 0.75 and an $SiO_2$ concentration of from 1 to 4% by weight, in which $[SiO_2]$ represents the concentration of $SiO_2$ per unit volume expressed as gram-molecules, and $[M]$ represents the concentration of alkali metal per unit volume expressed as gram-atoms, and wherein the content of potassium in the developer, in gram-atoms based on the total alkali metal content, is at least 20%.

6. The method of claim 1, wherein said light-sensitive layer is coated on the support in an amount of from 0.5 to about 7 g/m².

7. The method of claim 1, wherein said light-sensitive layer comprises an o-quinonediazide compound and an alkali-soluble resin.

8. The method of claim 7, wherein said alkali-soluble resin is a novolac-type phenolic resin.

9. The method of claim 7, wherein said alkali-soluble resin is present in an amount of 50 to 85% by weight and said o-quinonediazide is present in an amount of 15 to 50% by weight based on the weight of the light-sensitive layer.

10. The method of claim 1, wherein said light-sensitive layer contains an additive such that upon exposure and development the areas in which the light-sensitive layer is present are visually discernable from the uncovered support.

11. The method of claim 1, wherein said development is carried out with an automatic processor having a plurality of nozzle developer delivery means from which said developer is sprayed against the surface of said light-sensitive layer and also having developer storage means from which developer fed to said nozzle developer delivery means pipes is charged, said sprayed developer being recovered to said delivery storage means for reuse in said development.

12. The method of claim 11, wherein said developer has an $SiO_2$ concentration of from 1 to 3% by weight.

13. The method of claim 11, wherein said developer has an $[SiO_2]/[M]$ ratio of 0.5 to 0.65 and an $SiO_2$ concentration of 1.0 to 2.0% by weight.

14. The method of claim 11, wherein each of said developer and supplementary solutions contains at least 20%, as gram-atoms, of potassium based on the total amount of alkali metal therein.

15. The method of claim 14, wherein each of said solutions contains from about 20% to about 90%, as gram-atoms, of potassium based on the total amount of alkali metal therein.

16. The method of claim 14, wherein each of said solutions contains from about 30% to about 80%, as gram-atoms, of potassium based on the total amount of alkali metal therein.

17. The method of claim 15, wherein the source of said potassium present in the developer and the supplementary solution is at least one member selected from the group consisting of potassium hydroxide, potassium borate, potassium pyrophosphate, potassium tertiary phosphate, potassium polyphosphate and potassium silicate.

18. The method of claim 5, wherein said development is carried out with an automatic processor having a plurality of nozzle developer delivery means from which said developer is sprayed against the surface of said light-sensitive layer and also having developer storage means from which developer fed to said nozzle developer delivery means pipes is charged, said sprayed developer being recovered to said delivery storage means for reuse in said development.

19. The method of claim 18, wherein said developer has an $SiO_2$ concentration of from 1 to 3% by weight.

20. The method of claim 18, wherein said developer has an $[SiO_2]/[M]$ ratio of 0.5 to 0.65 and an $SiO_2$ concentration of 1.0 to 2.0% by weight.

21. The method of claim 18, wherein each of said developer and supplementary solutions contains at least 20%, as gram-atoms, of potassium based on the total amount of alkali metal therein.

22. The method of claim 21, wherein each of said solutions contains from about 20% to about 90%, as gram-atoms, of potassium based on the total amount of alkali metal therein.

23. The method of claim 21, wherein each of said solutions contains from about 30% to abbout 80%, as gram-atoms, of potassium based on the total amount of alkali metal therein.

24. The method of claim 22, wherein the source of said potassium present in the developer and the supplementary solution is at least one member selected from the group consisting of potassium hydroxide, potassium borate, potassium pyrophosphate, potassium tertiary phosphate, potassium polyphosphate and potassium silicate.

25. The method of claim 18, wherein said light-sensitive layer is coated on the support in an amount of from 0.5 to about 7 $g/m^2$.

26. The method of claim 18, wherein said light-sensitive layer comprises an o-quinonediazide compound and an alkali-soluble resin.

27. The method of claim 26, wherein said alkali-soluble resin is a novolac-type phenolic resin.

28. The method of claim 27, wherein said alkali-soluble resin is present in an amount of 50 to 85% by weight and said o-quinonediazide is present in an amount of 15 to 50% by weight based on the weight of the light-sensitive layer.

29. The method of claim 18, wherein said light-sensitive layer contains a dye such that upon exposure and development the areas in which the light-sensitive layer is present are visually discernable from the uncovered support.

30. The method of claim 26, wherein said o-quinonediazide compound is selected from the group consisting of o-naphthoquinonediazide and sulfonic acid esters or o-naphthoquinonediazide carboxylic acid esters of aromatic hydroxy compounds and o-naphthoquinonediazide sulfonic acid amides or o-naphthoquiononediazide carboxylic acid amides of aromatic anion compounds.

31. The method of claim 11, wherein the $[SiO_2]/[M]$ ratio and the $SiO_2$ concentration of said supplementary solution are such values as will maintain the corresponding developer ratio and concentrations as the developer is used to process said plate, or as time passes, within the original corresponding developer ratio and concentrations.

32. The method of claim 18, wherein the $[SiO_2]/[M]$ ratio and the $SiO_2$ concentration of said supplementary solution are such values as will maintain the corresponding developer ratio and concentrations as the developer is used to process said plate, or as time passes, within the original corresponding developer ratio and concentrations.

33. The method of claim 31, which is a continuous process.

34. The method of claim 32, which is a continuous process.

35. The method of claim 33, wherein said supplementary solution has an $[SiO_2]/[M]$ ratio the same as the developer but a higher $[M]$ concentration.

36. The method of claim 33, wherein said supplementary solution has the same $[SiO_2]$ concentration as the developer, but the $[SiO_2]/[M]$ ratio thereof is lower than that of the developer.

37. The method of claim 34, wherein said supplementary solution has an $[SiO_2]/[M]$ ratio the same as the developer but a high $[M]$ concentration.

38. The method of claim 37, wherein said supplementary solution has the same $[SiO_2]$ concentration as the developer, but the $[SiO_2]/[M]$ ratio thereof is lower than that of the developer.

\* \* \* \* \*